(12) United States Patent
Ito

(10) Patent No.: US 7,151,289 B2
(45) Date of Patent: Dec. 19, 2006

(54) FERROELECTRIC CAPACITOR AND SEMICONDUCTOR DEVICE HAVING A FERROELECTRIC CAPACITOR

(75) Inventor: Toshio Ito, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/768,185

(22) Filed: Feb. 2, 2004

(65) Prior Publication Data
US 2004/0195603 A1 Oct. 7, 2004

(30) Foreign Application Priority Data
Jan. 31, 2003 (JP) .............................. 2003-024772

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ...................... 257/295; 257/296; 257/303; 257/306; 257/307; 257/308; 257/309; 257/310

(58) Field of Classification Search ................ 257/295, 257/296, 303, 306–310, 269; 438/3
See application file for complete search history.

(56) References Cited

U.S. PATENT DOCUMENTS

| 5,335,138 | A | * | 8/1994 | Sandhu et al. .............. 361/303 |
| 5,708,284 | A | * | 1/1998 | Onishi ......................... 257/295 |
| 6,043,526 | A | * | 3/2000 | Ochiai ......................... 257/295 |
| 6,093,575 | A | * | 7/2000 | Eguchi .......................... 438/3 |
| 6,444,478 | B1 | * | 9/2002 | Basceri et al. .................. 438/3 |
| 6,459,111 | B1 | | 10/2002 | Natori et al. |
| 6,495,879 | B1 | * | 12/2002 | Kobayashi ................... 257/310 |

FOREIGN PATENT DOCUMENTS

| JP | 11-214626 | 8/1999 |
| JP | 2001-308287 | 11/2001 |

OTHER PUBLICATIONS

S.Y. Lee et al., "A FRAM technology using ITIC and triple metal layers for high performance and high density FRAMs", 1999 Symposium on VLSI Technology Digest of Technical Papers, pp. 141-142.

* cited by examiner

Primary Examiner—Douglas W. Owens
Assistant Examiner—Samuel A. Gebremaraim
(74) Attorney, Agent, or Firm—VolentineFrancos&Whitt, PLLC

(57) ABSTRACT

A ferroelectric capacitor including a bottom electrode which has a projecting portion, a top electrode, a ferroelectric layer and a dielectric layer formed between the bottom electrode and the top electrode. The dielectric layer is formed on a peripheral area of the bottom electrode. The ferroelectric layer is formed on the dielectric layer and on the projecting portion of the bottom electrode. As a result, a damaged layer which is formed during an etching process occurs at the ineffective area of the ferroelectric capacitor.

18 Claims, 13 Drawing Sheets

FERROELECTRIC CAPACITOR AND SEMICONDUCTOR DEVICE HAVING A FERROELECTRIC CAPACITOR

CROSS REFERENCE TO RELATED APPLICATION

A claim of priority under 35 U.S.C. §119 is made to Japanese Patent Application No. 2003-024772, filed Jan. 31, 2003, which is herein incorporated by reference in its entirety for all purposes.

BACKGROUND OF THE INVENTION

1. Field of the Invention

The present invention relates to a ferroelectric capacitor and a semiconductor device having a ferroelectric capacitor.

2. Description of the Related Art

A FeRAM(ferroelectric random access memory) uses a ferroelectric capacitor. Data can be read quickly from the FeRAM, which can be operated to provide random access. Therefore, the FeRAM is expected as a new type of non-volatile memory.

A memory cell of the FeRAM includes a switching transistor and a ferroelectric capacitor. The FeRAM uses a function of the ferroelectric layer for reversing an electric field by an intrinsic polarization and for retaining the electric field.

The FeRAM is classified broadly into either a planar type or a stack type. In the planar type FeRAM, a top electrode of the ferroelectric capacitor is connected to a source electrode of a corresponding switching transistor.

In the stack type FeRAM, a bottom electrode of the ferroelectric capacitor is connected to the source electrode of the switching transistor via a conductive plug. Therefore, an area of a memory cell of the stack type FeRAM is smaller than an area of a memory cell of the planar type FeRAM. Such technique is shown in a "A FRAM technology using 1T1C and triple metal layers for high performance and high density FRAMs", S. Y. Lee et al., 1999 Symposium on VLSI Technology Digest of Technical Papers, 1999, pp. 141–142. Alternatively, a FeRAM structure that has a cross-sectional area of a bottom electrode smaller than a cross-sectional area of a ferroelectric layer is described in Japanese Patent Laid-Open No 2001-308287.

In the conventional FeRAM, a bottom electrode layer, a ferroelectric layer and a top electrode layer are formed in order, and then, these layers are etched all at once. However, a damaged layer might be formed on a side surface of the ferroelectric layer. The damaged layer is made by a reaction between a material of the ferroelectric layer, the top electrode or the bottom electrode and etching gas. If a damaged layer is formed, normal operation of the ferroelectric capacitor might be inhibited and reliability of the ferroelectric capacitor might not be ensured.

For solving the above problem, an alternative fabricating process for fabricating the FeRAM device is as follows. First, the bottom electrode layer is formed, and then the bottom electrode layer is etched to form the bottom electrode. Then, the ferroelectric layer is formed on the bottom electrode and the top electrode layer is formed on the ferroelectric layer. Then, the ferroelectric layer and the top electrode layer are etched to form the ferroelectric capacitor.

However, in the FeRAM device which is fabricated by these above steps, oxygen is diffused in an insulating layer formed under the bottom electrode, while the ferroelectric layer is formed under an oxygen atmosphere. As a result, a plug which is embedded in the insulating layer is oxidized and a connection between the bottom electrode and a source electrode of a switching transistor might be disconnected.

Also, a process that reestablishes the function of the ferroelectric layer by cleaning the damaged layer has been considered. However, an amount of remaining polarization is not increased after the cleaning. Such process therefore is not an effective solution.

SUMMARY OF THE INVENTION

Accordingly, in one aspect of the present invention, a ferroelectric capacitor for reducing an influence of a damaged layer is provided. The ferroelectric capacitor includes a bottom electrode which has a projecting portion, a top electrode, a ferroelectric layer and a dielectric layer formed between the bottom electrode and the top electrode. The dielectric layer is formed on a peripheral area of the bottom electrode. The ferroelectric layer is formed on the dielectric layer and on the projecting portion of the bottom electrode.

DETAILED DESCRIPTION OF THE PREFERRED EMBODIMENTS

Figure 1:
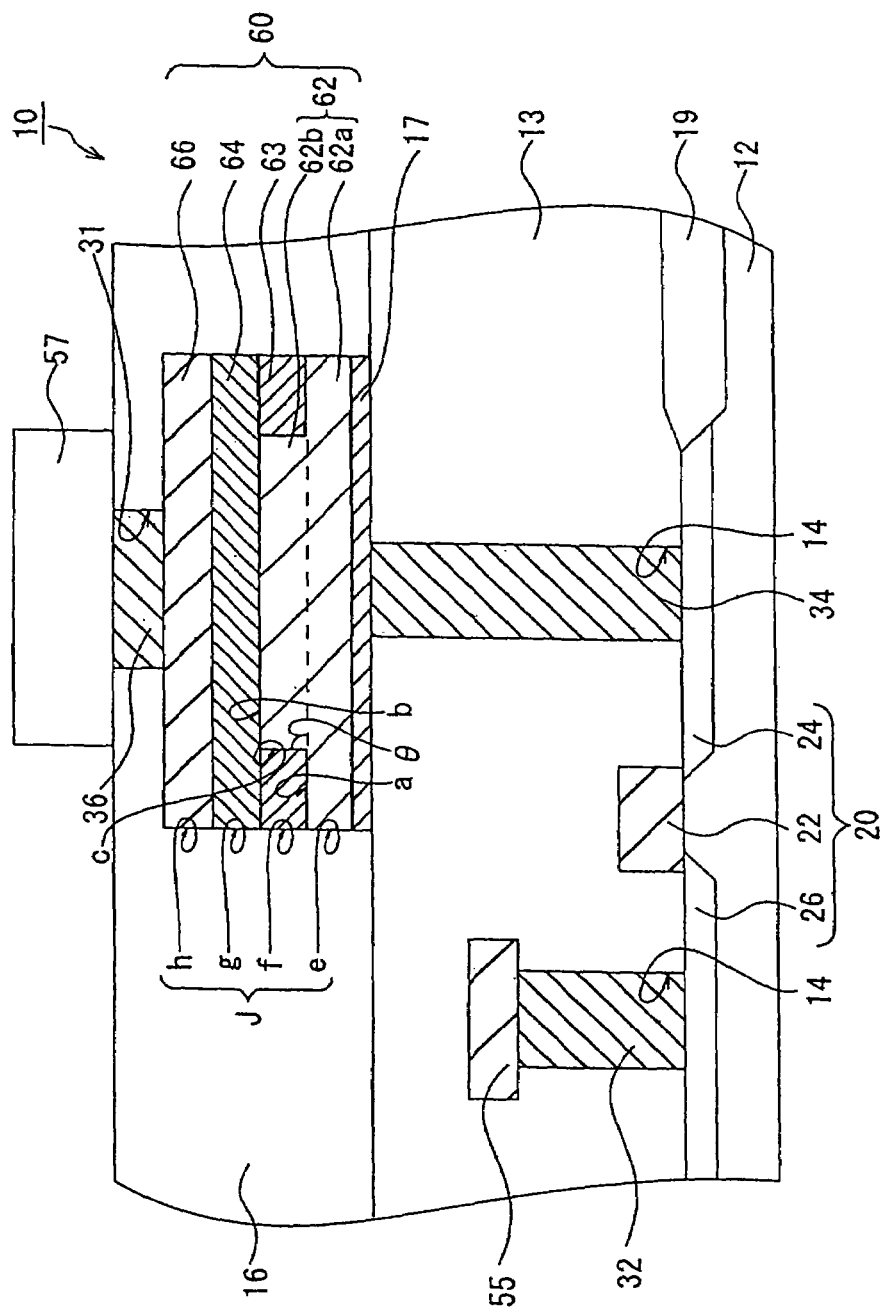
FIG. 1 is a cross-sectional view showing a semiconductor device of a first embodiment of the present invention.

A semiconductor device according to preferred embodiments of the present invention will be explained hereinafter with reference to the accompanying figures. In order to simplify the explanation, like elements are given like or corresponding reference numerals. Dual explanations of the same elements are avoided.

First Preferred Embodiment

FIG. 1 is a cross-sectional view showing a semiconductor device 10 of a first embodiment of the present invention. The semiconductor device 10 as shown in FIG. 1 is a cross-sectional view taken along line 1–1' in FIG. 2. In this embodiment, a stack type FeRAM is described.

Figure 2:
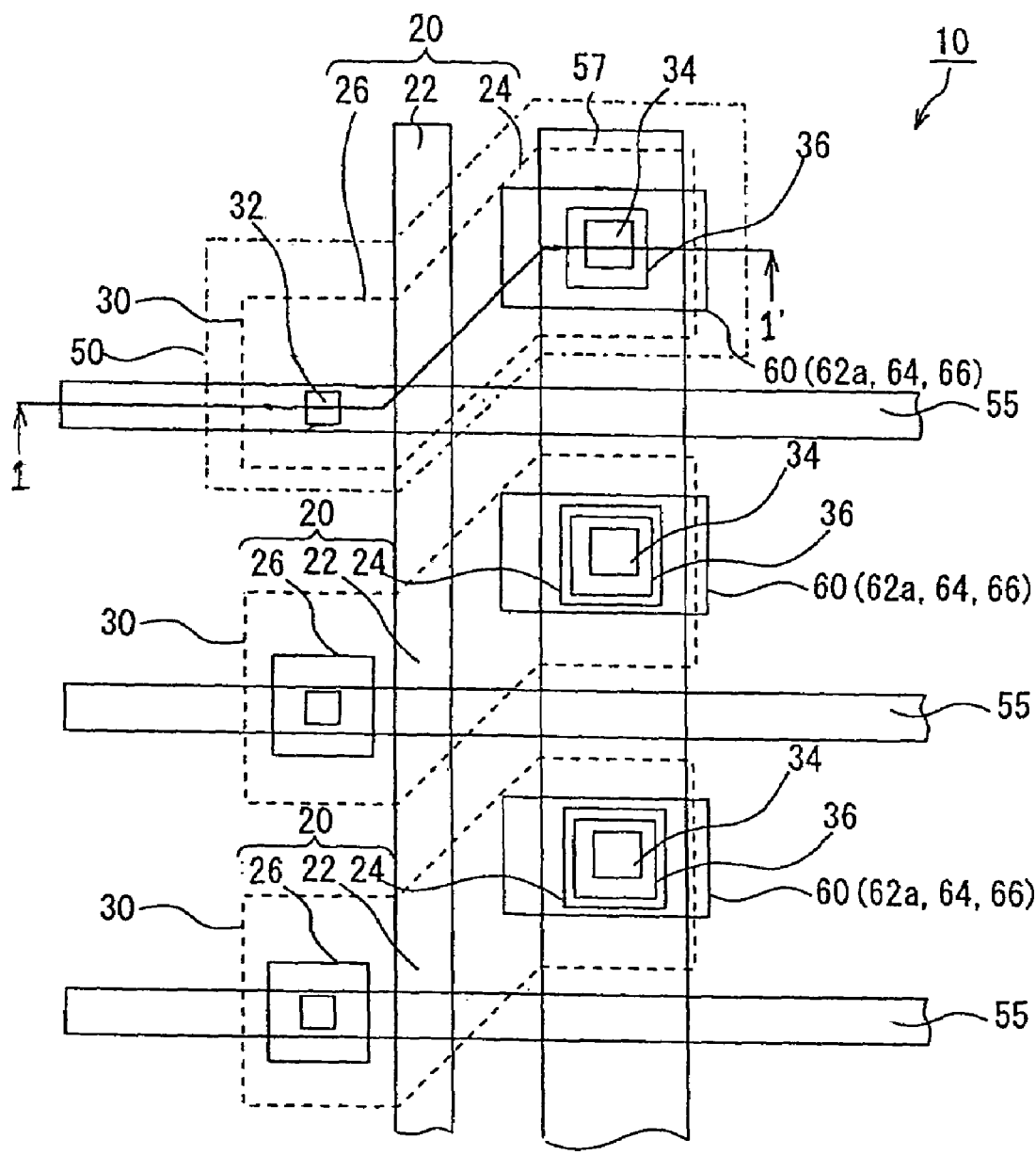
FIG. 2 is a plane view showing the semiconductor device of the first embodiment of the present invention.

Initially, the semiconductor device 10 is explained in reference to FIG. 2. A memory cell 50 of the semiconductor device 10 includes a MOSFET(Metal Oxide Semiconductor Field Effect Transistor) 20 and a ferroelectric capacitor 60 as shown in FIG. 2. The transistor 20 includes a source region as a first region 24 and a drain region as a second region 26 and a gate electrode as a control electrode 22. The first region 24 and the second region 26 are formed in an active area 30 and the gate electrode 22 is arranged on an area which is located between the first region 24 and the second region 26. The gate electrode 22 is used as a word line in the semiconductor device 10. The drain region 26 is connected to a bit line 55 via a bit line contact 32. The source region 24 is connected to a bottom electrode 62 of the ferroelectric capacitor 60 via a plug 34. The ferroelectric capacitor 60 includes a ferroelectric layer 64 formed between the bottom electrode 62 and a top electrode 66. The top electrode 66 is connected to the plate line 57 via a plate contact 36. In this type of the semiconductor device, bit line 55 is extended in a direction perpendicular to each of the gate electrode 22 and the plate line 57.

Then, the device structure of the semiconductor device 10 is explained in reference to FIG. 1. The transistor 20 includes the gate electrode 22, the source region 24 and the drain region 26 as shown in FIG. 1. The gate electrode 22 is formed on the silicon substrate 12 via a gate insulating layer (not shown). The source region 24 and the drain region 26 are formed in the semiconductor substrate 12 located at both sides of the gate electrode 22. An insulating layer 13 such as silicon dioxide is formed on the transistor 20 and the silicon substrate 12, and a top surface of the insulating layer is flattened.

The source region 24 is connected to the bottom electrode 62 via the plug 34 which is formed in the insulating layer 13. The plug 34 is formed by embedding a conductive material such as poly crystalline silicon or tungsten in a contact hole 14 which is formed in the insulating layer 13. Further, a barrier metal 17 such as titanium nitride or aluminum nitride is formed between the plug 34 and the bottom electrode 62. The barrier metal 17 inhibits a counter diffusion of the metal. The barrier metal 17 can be formed in the contact hole 14. Also, an adhesive layer such as a titanium dioxide layer for improving an adhesion between the barrier metal 17 and the bottom electrode 62 can be used.

The drain region 26 is connected to a bit line 55 such as tungsten or tungsten silicide via a bit line contact 32 which is formed in the insulating layer 13. The bit line contact 32 is formed by embedding a conductive material such as poly crystalline silicon or tungsten in a contact hole 14 which is formed in the insulating layer 13. An insulating layer 19 divides the adjacent transistors.

The ferroelectric capacitor 60 includes the bottom electrode 62 formed on the barrier metal 17, a dielectric layer 63 formed on the bottom electrode 62, the ferroelectric layer 64 formed on the bottom electrode 62 and the dielectric layer 63, and the top electrode 66 formed on the ferroelectric layer 64. The bottom electrode 62 includes a plate portion 62a and a projection portion 62b formed on a surface "a" of the plate portion 62a. The plate portion 62a and the projection portion 62b are made of platinum. The projection portion 62b is located at a central area of the surface "a" of the plate portion 62a. The dielectric layer 63 is formed around the projection portion 62b and a top surface of the dielectric layer 63 is aligned or substantially coplanar with a top surface "b" of the projection portion 62b. The dielectric layer 63 is made of silicon dioxide or silicon nitride. The ferroelectric layer 64 is formed on the top surface "b" of the projection portion 62b and on the dielectric layer 63. The ferroelectric layer 64 is made of strontium bismuth tantalate ($SrBi_2Ta_2O_9$). The top electrode 66 is formed on the ferroelectric layer 64 and is made of platinum.

In this embodiment, the capacitor 60 is rectangular in shape. Also, the projection portion 62a is rectangular in shape. Each side of the projection portion 62b of the bottom electrode 62 is shorter than corresponding side of the plate portion 62a of the bottom electrode 62. A side surface "e" of the plate portion 62a, a side surface "f" of the dielectric layer 63, a side surface "g" of the ferroelectric layer 64 and a side surface "h" of the top electrode 64 are aligned with each other.

In the alternative, a side surface of the projection portion 62b can be formed in a forward tapered shape. Preferably, an angle θ between the surface "a" of the plate portion 62a and the side surface "c" of the projection portion 62b ranges from 70° to 80° so that the projection portion 62b can be easily formed. The top electrode 66 and the bottom electrode 62 can be made of oxidation resistance metal such as iridium(Ir), ruthenium(Ru) or strontium ruthenium oxide ($SrRuO_3$), or conductive metal oxide such as iridium oxide ($IrO_2$) or ruthenium oxide($RuO_2$). The ferroelectric layer 64 can be made of lead zirconate titanate($PbZrTiO_3$), lanthanum (La), lead zirconate titanate doped with lanthanum, strontium bismuth tantalate doped with niobium or bismuth lanthanum titanate($LaBiTiO_3$). These materials are applicable in following embodiment.

The ferroelectric capacitor 60 is formed in an insulating layer 16 such as silicon dioxide. A top surface of the insulating layer 16 is flattened and aligned to a top surface of a plate line contact 36 such as tungsten which is formed on the top electrode 66. The top electrode 66 is connected to a plate line 57 such as aluminum via the plate line contact 36.

Next, a method of fabricating the semiconductor device 10 is explained with reference to FIGS. 3(A) to 3(C) and FIGS. 4(A) and 4(B).

Figure 3A:
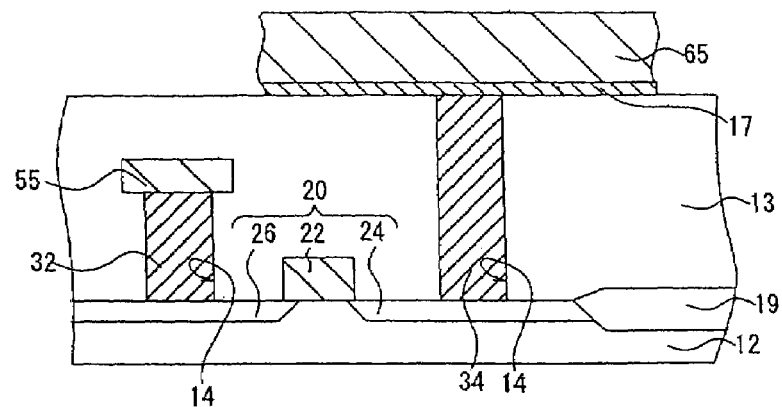
FIGS. 3(A) to 3(C) are views showing manufacturing steps for a semiconductor device of the first embodiment of the present invention.
Figure 3B:
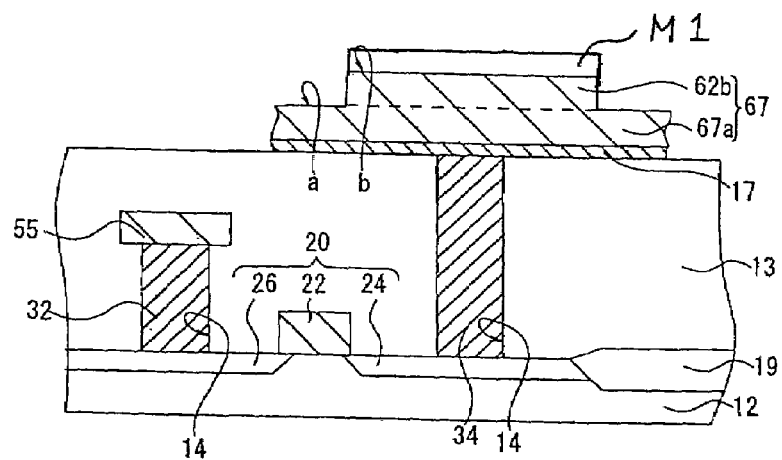

First, as shown in FIG. 3(A), the insulating layer 19, the transistor 20, bit line contact 32 and the bit line 55 are formed on the semiconductor substrate 12. Then, the insulating layer 13 is formed on the semiconductor substrate 12 and the top surface of the insulating layer 13 is flattened by a CMP(Chemical Mechanical Polishing) technique.

Then, another contact hole 14 for the capacitor is formed in the insulating layer 13. A tungsten layer is formed in the contact hole 14 and on the insulating layer 13. Then, for forming the plug 34, the tungsten layer is polished by the CMP technique so as to align with the top surface of the insulating layer 13.

Then, the barrier metal 17 that has 70 nm thickness such as titanium nitride is formed on the insulating layer 13 by reactive sputtering technique. The barrier metal 17 contacts the top surface of the plug 34.

Then, as shown in FIG. 3(A), a platinum layer 65 that has 150 nm thickness is formed on the barrier metal 17 by a sputtering technique.

Then, as shown in FIG. 31(B), a mask M1 such as silicon nitride or titanium nitride is formed on the platinum layer 65. The platinum layer 65 is etched by using the mask M1 so that the projection portion 62b is formed. For example, a size of the projection portion 62b is 1040 nm by 800 nm and a thickness is 75 nm. In this step, a bottom electrode layer 67 which has the projection portion 62b formed on a platinum layer 67a is obtained.

Figure 3C:
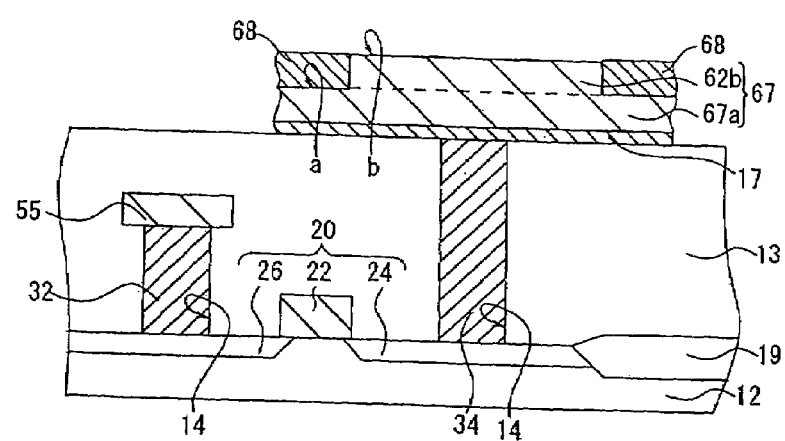

Then, as shown in FIG. 3(C), a dielectric layer 68 is formed on the bottom electrode 67 and the dielectric layer 68 is etched back so that the top surface "b" of the projection portion 62b is exposed from the dielectric layer 68. As a result, a top surface of the dielectric layer 68 is aligned to the top surface "b" of the projection portion 62a.

Figure 4:
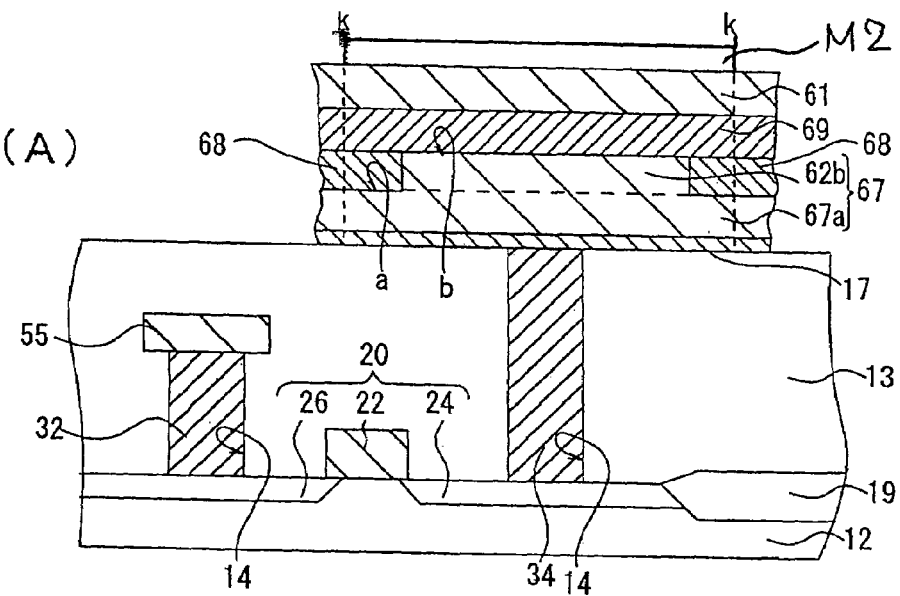
FIGS. 4(A) and 4(B) are views showing a manufacturing steps for a semiconductor device of the first embodiment of the present invention.
Figure 4:
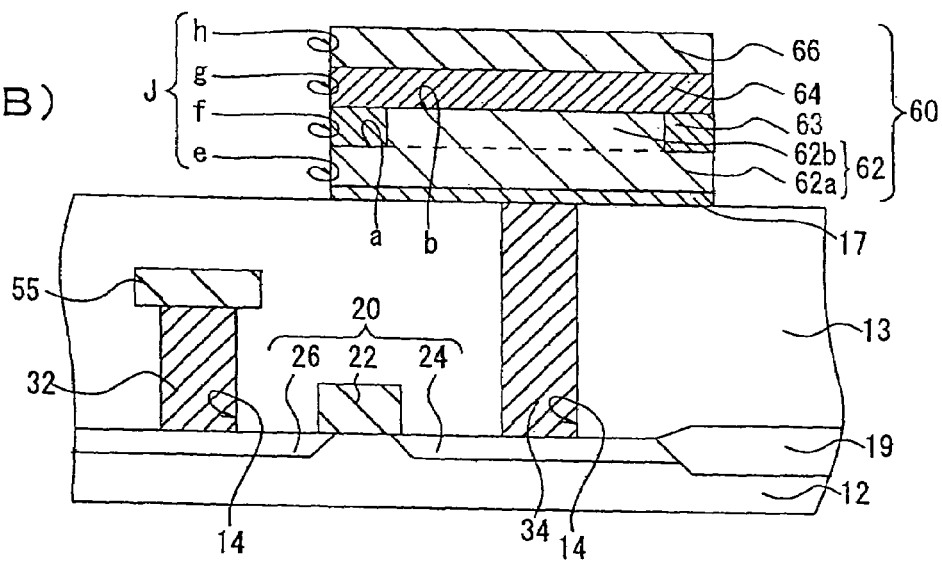

Then, a strontium bismuth tantalate solution is supplied on the dielectric layer 68 and the projection portion 62a by a spin coat method. After the solution is dried, the dried solution is annealed in an oxygen atmosphere at 700° C. for one minute by an RTA(Rapid Thermal Anneal) method. As a result, a strontium bismuth tantalate layer that has 50 nm thickness is obtained. Then, the coating step and the RTA step are again performed another two times at 750° C. for one minute, as shown in FIG. 4(A). As a result, a 150 nm thickness strontium bismuth tantalate layer 69 is obtained.

Then, a 100 nm thickness platinum layer 61 as the top electrode layer is formed on the strontium bismuth tantalate layer 69 by a sputtering method. Then, a mask M2 such as silicon dioxide is formed on the top electrode layer 61 as further shown in FIG. 4(A). A size of the mask M2 is 1300 nm by 1000 nm, and the mask M2 is arranged so that a distance from each side of the projection portion 62a to corresponding sides of the mask M2 will be equal.

Then, the top electrode layer 61, the ferroelectric layer 69, the dielectric layer 68, the plate portion 67a of the bottom electrode layer 67, and the barrier metal 17 are etched by using the mask M2 so that the side surface "e" of the plate portion 62a, the side surface "f" of the dielectric layer 63, the side surface "g" of the ferroelectric layer 64 and the side surface "h" of the top electrode 66 are aligned. Then the mask M2 is removed and the ferroelectric capacitor 60 is obtained as shown in FIG. 4(B).

In this embodiment, a photomask which is used for exposing a photoresist to form the mask M2 can be the same photomask which is used for exposing a photoresist to form the mask M1. If an exposing amount is changed, an exposed area is changed. In this embodiment, an exposing amount of the photoresist for forming the mask M1 is greater than an exposing amount of the photoresist for forming the mask M2.

Then, the insulating layer 16 is formed on the ferroelectric capacitor 60. The top surface of the insulating layer 16 is flattened by the CMP technique. Then, a contact hole 31 is formed in the insulating layer 16 so as to expose the top electrode 66. After a tungsten layer is formed in the contact hole 31 and on the insulating layer 16, the tungsten layer is polished so as to remove the tungsten layer which is formed on the insulating layer 16. The remaining tungsten layer is plate line contact 36. Then, the plate line 57 such as aluminum is formed on the plate line contact 36.

In this embodiment, the bottom electrode layer 67, the dielectric layer 68, the ferroelectric layer 69 and the top electrode layer 61 are etched as shown in FIG. 4(A) by using the common mask M2. In the alternative, the top electrode layer 61 can be formed after the bottom electrode 62, the dielectric layer 63 and the ferroelectric layer 64 are formed.

Figure 5:
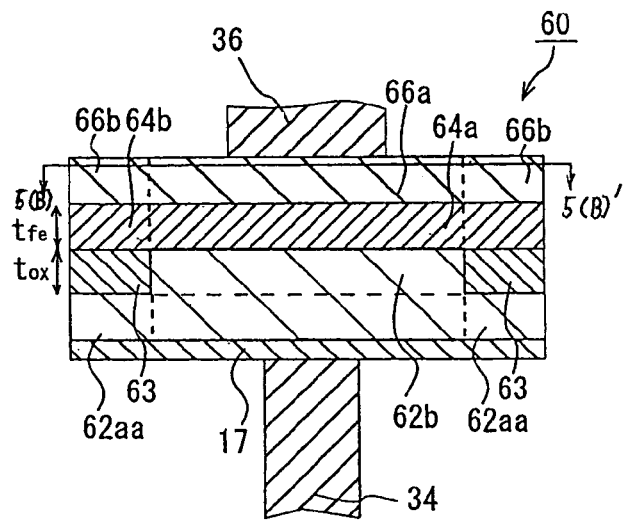
FIGS. 5(A) to 5(C) are views showing a ferroelectric capacitor of the first embodiment of the present invention.
Figure 5:
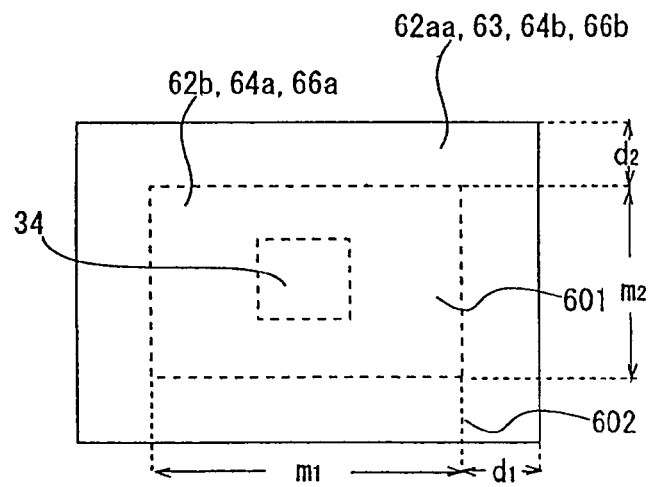
Figure 5:
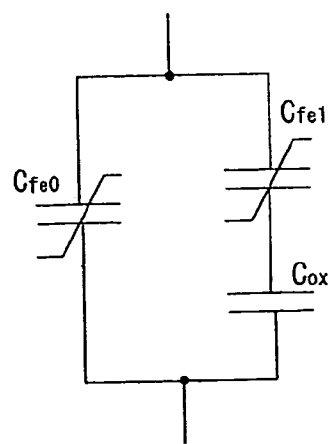

An effective area of the ferroelectric capacitor is explained with reference to FIG. 5(A) to FIG. 5(C). FIG. 5(A) shows a cross-sectional view showing the ferroelectric capacitor 60. FIG. 5(B) is a plane view taken along line 5(B)–5(B)' in FIG. 5(A). FIG. 5(C) is a equivalent circuit of the ferroelectric capacitor 60.

In this embodiment, the effective area 601 of the ferroelectric capacitor 60 is an area which includes the projection portion 62b, an area 66a of the top electrode which faces the projection portion 62b, and an area 64a of the ferroelectric layer 64 which is located between the projection portion 62b and the area 66a as shown in FIG. 5(A) and FIG. 5(B).

A thickness of the ferroelectric layer 64 is shown as "$t_{fe}$" and a thickness of the dielectric layer 63 is shown as "$t_{ox}$".

The ferroelectric capacitor 60 includes a ferroelectric capacitor $C_{fe0}$ in the effective area 601 and a dielectric capacitor $C_{ox}$ in a spacer area 602. The dielectric capacitor Cox includes the dielectric layer 63 and a corresponding part of the bottom electrode 62aa and the top electrode 66b. A ferroelectric capacitor $C_{fe1}$ includes a ferroelectric layer 64b which corresponds to the dielectric layer 63, and a corresponding part of the top electrode 66b and the bottom electrode 62aa.

FIG. 5(c) shows a connection of each capacitor. The ferroelectric capacitor $C_{fe1}$ and the dielectric capacitor $C_{ox}$ are connected serially. The ferroelectric capacitor $C_{fe0}$ is connected to these serial connected capacitors $C_{fe1}$ and $C_{ox}$ in parallel. The connection of the ferroelectric capacitor $C_{fe0}$, the ferroelectric capacitor $C_{fe1}$ and the dielectric capacitor $C_{ox}$ are electrically equal to the ferroelectric capacitor 60.

Therefore, a capacitance "D" of the ferroelectric capacitor 60 is shown in the following equation (1). In the following equation, a capacitance of the ferroelectric capacitor $C_{fe0}$ is shown as $D_{fe0}$, a capacitance of the ferroelectric capacitor $C_{fe1}$ is shown as $D_{fe1}$ and a capacitance of the dielectric capacitor $C_{ox}$ is shown as $D_{ox}$.

$$D = D_{fe0} + (D_{fe1} * D_{ox})/(D_{fe1} + D_{ox}) \quad (1)$$

The effective area 601 has a size of $m_1$ by $m_2$ and a width of d1 along the short sides of the rectangular shaped area of the capacitor structure and a width of d2 along the longer sides of the rectangular shaped area. A dielectric constant of the ferroelectric layer 64 is shown as $\in_{fe}$, a dielectric constant of the dielectric layer 63 is shown as $\in_{ox}$. A capacitance of each capacitor is shown in the following equations.

$$D_{fe0} = (\in_{fe} * m_1 * m_2)/t_{fe} \quad (2)$$

$$D_{fe1} = 2\in_{fe}(m_2 * d_1 + m_1 * d_2 + 2d_1 * d_2)/t_{ox} \quad (3)$$

$$D_{ox} = 2\in_{ox}(m_2 * d_1 + m_1 * d_2 + 2d_1 * d_2)/tox \quad (4)$$

The thickness $t_{fe}$ and the thickness $t_{ox}$ are 150 nm. A voltage of 3V is applied to the ferroelectric capacitor 60. The dielectric constant $\in_{fe}$ of strontium bismuth tantalate as the ferroelectric layer 64 is forty times larger than the dielectric constant $\in_{ox}$ of silicon dioxide as the dielectric layer 63.

As a result, a voltage of 3V is applied to the effective area of the ferroelectric capacitor $C_{fe0}$. However, a voltage of 0.075V, which is 1/40 of the voltage applied to, is applied to the dielectric capacitor $C_{ox}$, is applied to the spacer area of the ferroelectric capacitor $C_{fe1}$.

The ferroelectric capacitor $C_{fe1}$ does not exhibit a hysteresis characteristic under the voltage of 0.075V. Therefore, the capacitance of the spacer area 602 is substantially the same as the capacitance of the dielectric capacitor $C_{ox}$. As a result, the capacitance D of the ferroelectric capacitor 60 is as shown in the following equation (5).

$$D = Dfe0 + (Dfe1 * Dox)/(Dfe1 + Dox) = D_{fe0} + D_{ox} \quad (5)$$

The leakage of a charge caused by the spacer area 602 can be ignored. The reason is explained as follows.

For example, the size of the top electrode 66 and the size of the plate portion 62a of the bottom electrode 62 are 1300 nm by 1000 nm and each width of the spacer $d_1$ and $d_2$ are 10% of each side. That is, $m_1$ is 1040 nm, $m_2$ is 800 nm, $d_2$ is 1300 nm and $d_1$ is 100 nm.

In reference to equations (2), (4) and (5), the capacitance $D_{ox}$ of the spacer area 602 is 1/80 of the capacitance D of the ferroelectric capacitor 60. In the alternative, if lead zirconate titanate is used as the ferroelectric layer 63, the capacitance $D_{ox}$ of the spacer area is 1/320 of the capacitance D of the ferroelectric capacitor 60.

In this embodiment, the effective area of the ferroelectric capacitor is the same as the area of the top surface of the projection portion 62b. Therefore, the damage area which is formed on the side surface of the ferroelectric layer 64 is arranged at the spacer area which is out of the effective area. That is, since the dielectric layer 63 decreases an electric field strength at a peripheral area of the capacitor, an influence of the damaged layer can be ignored.

In this embodiment, the step of forming the ferroelectric layer 69 in an oxygen atmosphere is performed on the bottom electrode layer 67 which has a function of oxidation resistance. Therefore, an oxidation of the plug 34 is inhibited by the bottom electrode 67.

Second Preferred Embodiment

Figure 6:
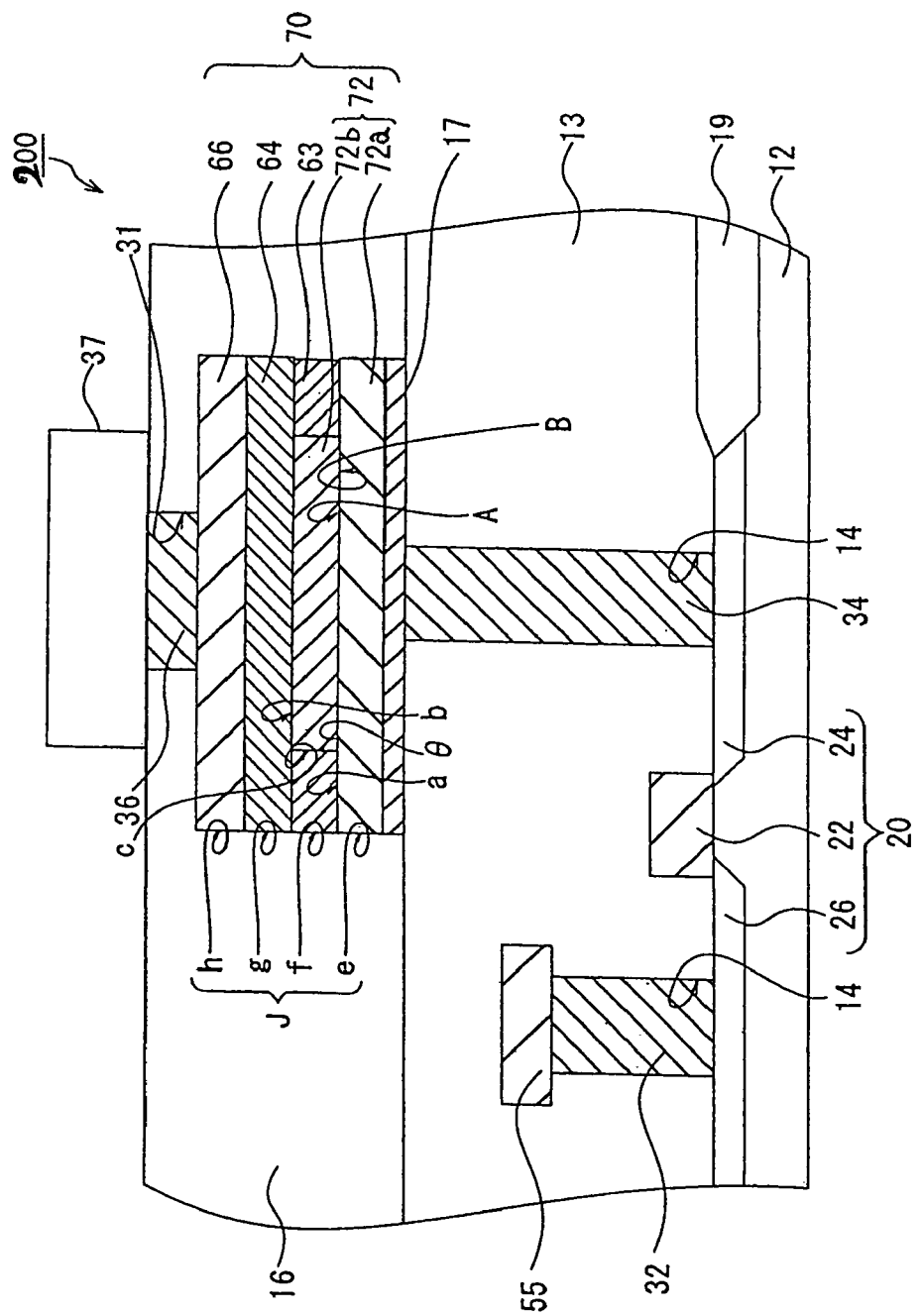
FIG. 6 is a cross-sectional view showing a semiconductor device of a second embodiment of the present invention.

In the second embodiment, a projection portion 72a of a bottom electrode 72 and a plate portion 72b of the bottom electrode 72 are made of different material as shown in FIG. 6.

In this embodiment, the bottom electrode 72 of a ferroelectric capacitor 70 includes the plate portion 72a such as iridium and the projection portion 72b such as iridium oxide.

Figure 7A:
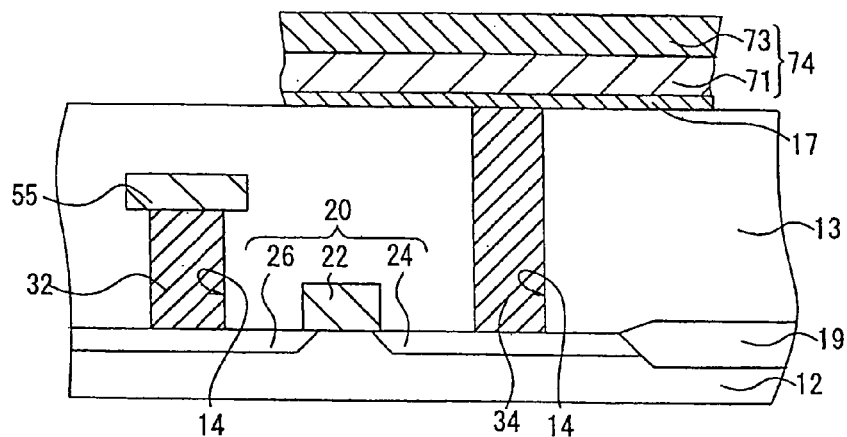
FIGS. 7(A) to 7(C) are views showing manufacturing steps for a semiconductor device of the second embodiment of the present invention.
Figure 7B:
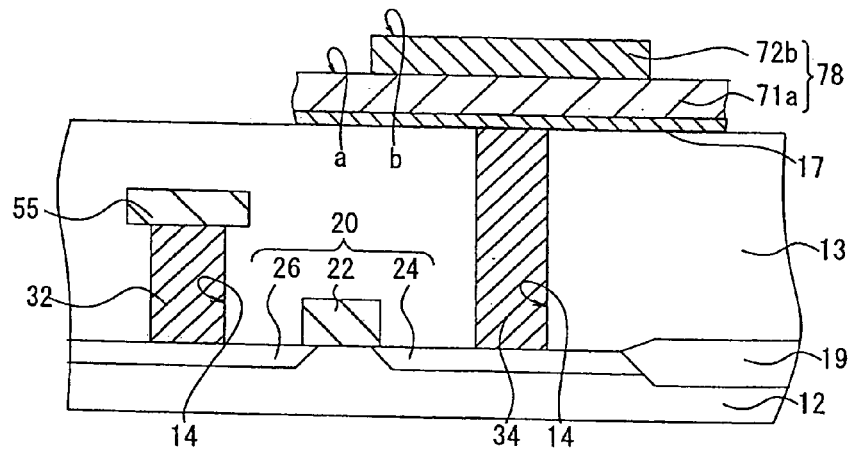
Figure 7C:
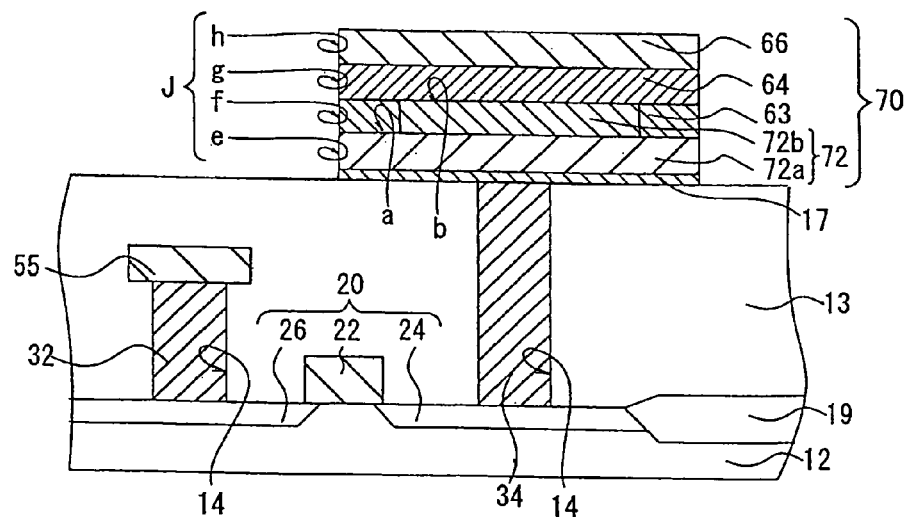

Next, a method of fabricating a semiconductor device 200 is explained in reference with FIGS. 7(A)–7(C).

From the step for forming the transistor 20 to the step for forming plug 34 are performed as described in the first embodiment.

Then, the iridium layer 71 which has 100 nm thickness is formed on the barrier metal 17 by a sputtering technique. Then, the iridium oxide layer 73 which has 100 nm thickness is formed on the iridium layer 71 by a reactive sputtering technique as shown in FIG. 7(A). The iridium layer 71 and the iridium oxide layer 73 form a conductive layer 74 for forming the bottom electrode.

Then, the iridium oxide layer 73 is etched so that the projection portion 72b is formed and the iridium layer 71a is exposed, as shown in FIG. 7(B). The iridium oxide layer 73 is etched by a mixed gas of chlorine(Cl) and oxygen($O_2$).

In this step, a bottom electrode layer 78 which has a projection portion 72b is obtained as shown in FIG. 7(B).

Then, the dielectric layer, the ferroelectric layer and the top electrode layer are formed and the etching step is performed as described in the first embodiment, as shown in FIG. 7(C). The side surface "e" of the plate portion 72a, the side surface "f" of the dielectric layer 63, the side surface "g" of the ferroelectric layer 64 and the side surface "h" of the top electrode 66 are aligned. In the alternative, a combination of the projection portion 72b and the plate portion 72a can be selected from a combination of Pt/$IrO_2$, Ru/Ir, Ru/$IrO_2$, $RuO_2$/Ir and $RuO_2$/$IrO_2$.

Accordingly, since the bottom electrode layer 72 is made of two stacked layers of different material, an end point of etching for forming the projection portion 72b is found easily. Therefore, the projection portion 72b is formed with accuracy.

Third Preferred Embodiment

Figure 8:
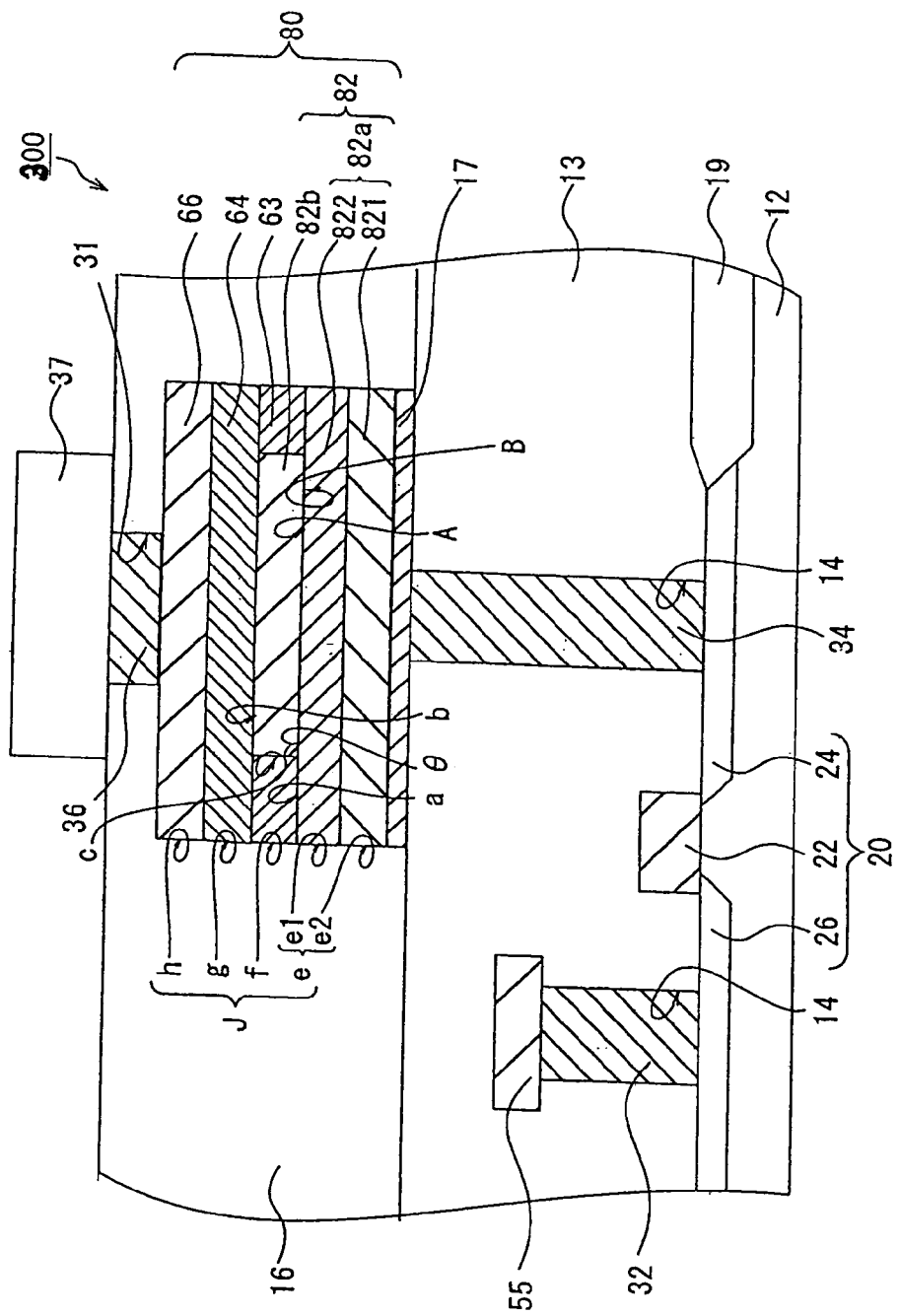
FIG. 8 is a cross-sectional view showing a semiconductor device of a third embodiment of the present invention.
Figure 9A:
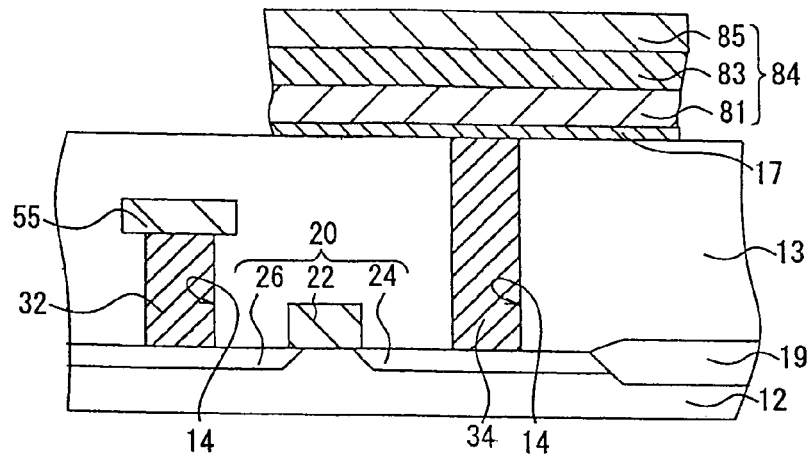
FIGS. 9(A) to 9(C) are views showing manufacturing steps for a semiconductor device of the third embodiment of the present invention.
Figure 9B:
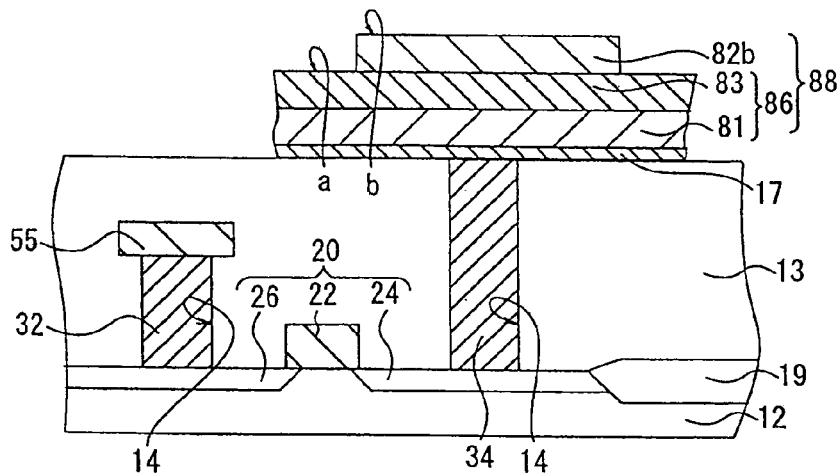
Figure 9C:
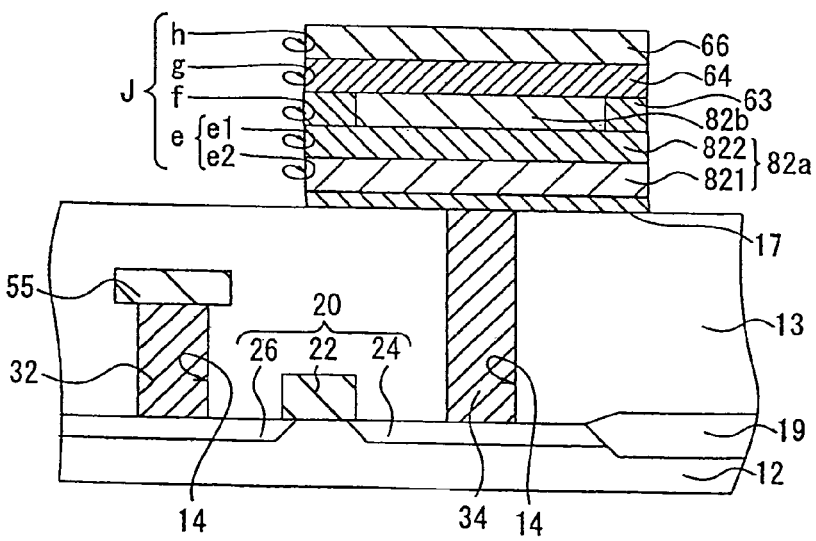

FIG. 8 is a cross-sectional view showing a semiconductor device 300 of a third embodiment of the present invention. FIGS. 9(A) to (C) are views showing manufacturing steps for a semiconductor device 300 of the third embodiment of the present invention.

The bottom electrode 82 includes a stacked plate portion 82a and a projection portion 82b such as platinum formed on the stacked plate portion 82a. The stacked plate portion 82a includes an iridium layer 821 as a lower layer and an iridium oxide layer 822 as an upper layer.

The iridium oxide layer 822 has good adhesive characteristic for adhering to the platinum projection portion 82b. The iridium layer 821 has a function for resisting oxidation. As a result, an end point of etching for forming the projection portion 82b is found easily, and the platinum projection portion 82b can be used. That is, the platinum projection portion 82b which improves a capacitor characteristic and the iridium layer 821 can be used as the bottom electrode 82 without peeling of layers.

Then, the manufacturing steps are explained in reference with FIGS. 9(A) to (C).

From the step for forming the transistor 20 to the step for forming the plug 34 are performed as described in the first embodiment.

Then, a conductive layer 84 as shown in FIG. 9(A) is formed as following steps. An iridium layer 81 having 100 nm thickness is formed on the barrier metal 17 by a sputtering technique, an iridium oxide layer 83 having 50 nm thickness is formed on the iridium layer 81 by a reactive sputtering technique, and a platinum layer 85 having 10 nm thickness is formed on the iridium oxide layer 83 by a sputtering technique.

Then, the platinum layer 85 is etched so that the projection portion 82b is formed and the iridium oxide layer 83 is exposed. The platinum layer 85 is etched by a mixed gas of chlorine(Cl) and argon(Ar). In this step, a bottom electrode layer 88 which has a projection portion 82b is obtained as shown in FIG. 9(B).

Then, the dielectric layer, the ferroelectric layer and the top electrode layer are formed and the etching step is performed as described in the first embodiment as shown in FIG. 9(C). The side surface "e" of the plate portion 82a, the side surface "f" of the dielectric layer 63, the side surface "g" of the ferroelectric layer 64 and the side surface "h" of the top electrode 66 are aligned. In the alternative, a combination of the projection portion 82b/the upper side of the plate portion 822/the under side of the plate portion 821 can be selected from a combination of Ir/$IrO_2$/Ir, Ru/$IrQ_2$/Ir and Ru/$RuO_2$/Ir.

The bottom electrode such as platinum has a good ferroelectric characteristic. In this embodiment, the platinum bottom electrode can be used without peeling.

Fourth Preferred Embodiment

Figure 10:
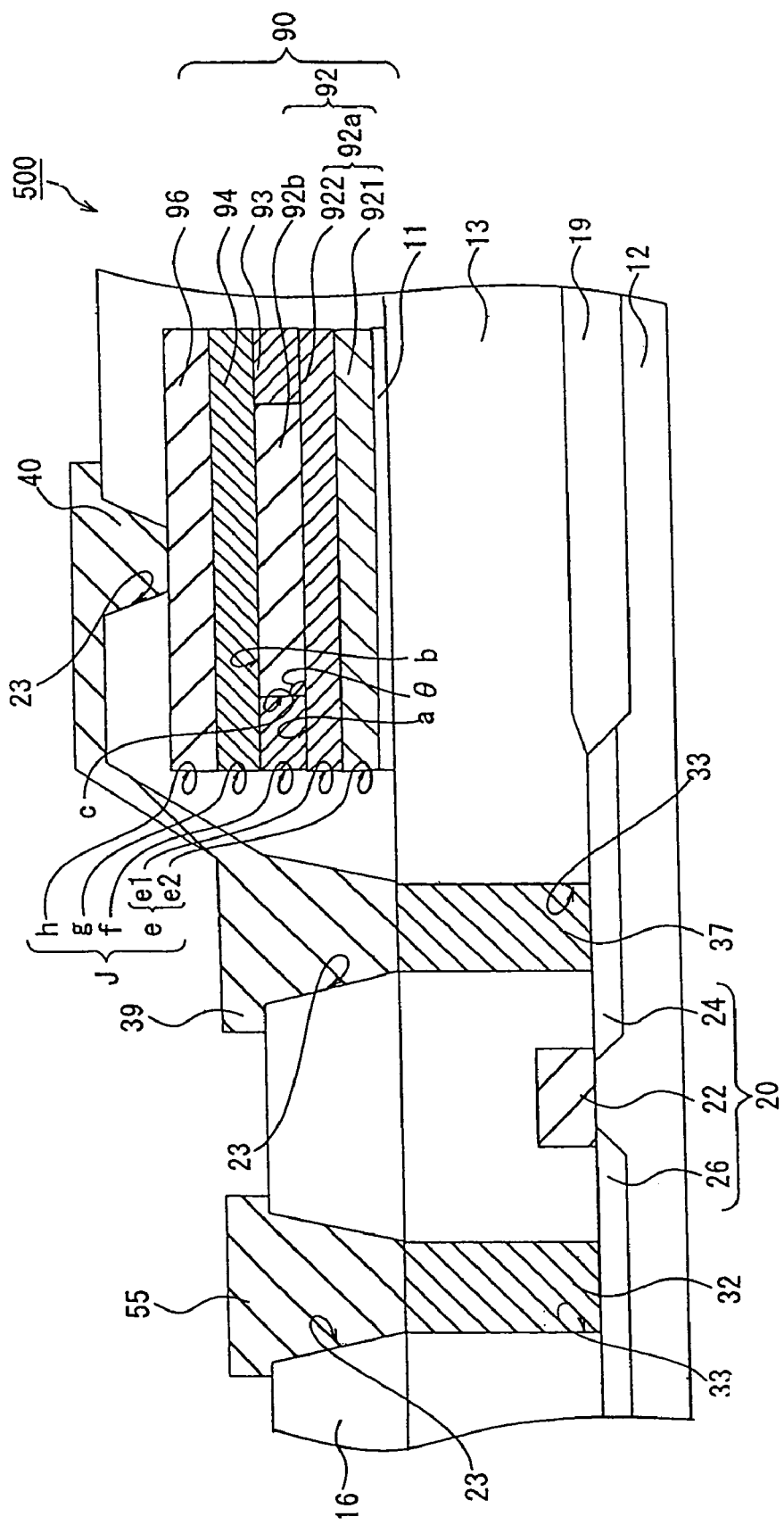
FIG. 10 is a cross-sectional view showing a semiconductor device of a fourth embodiment of the present invention.
Figure 11:
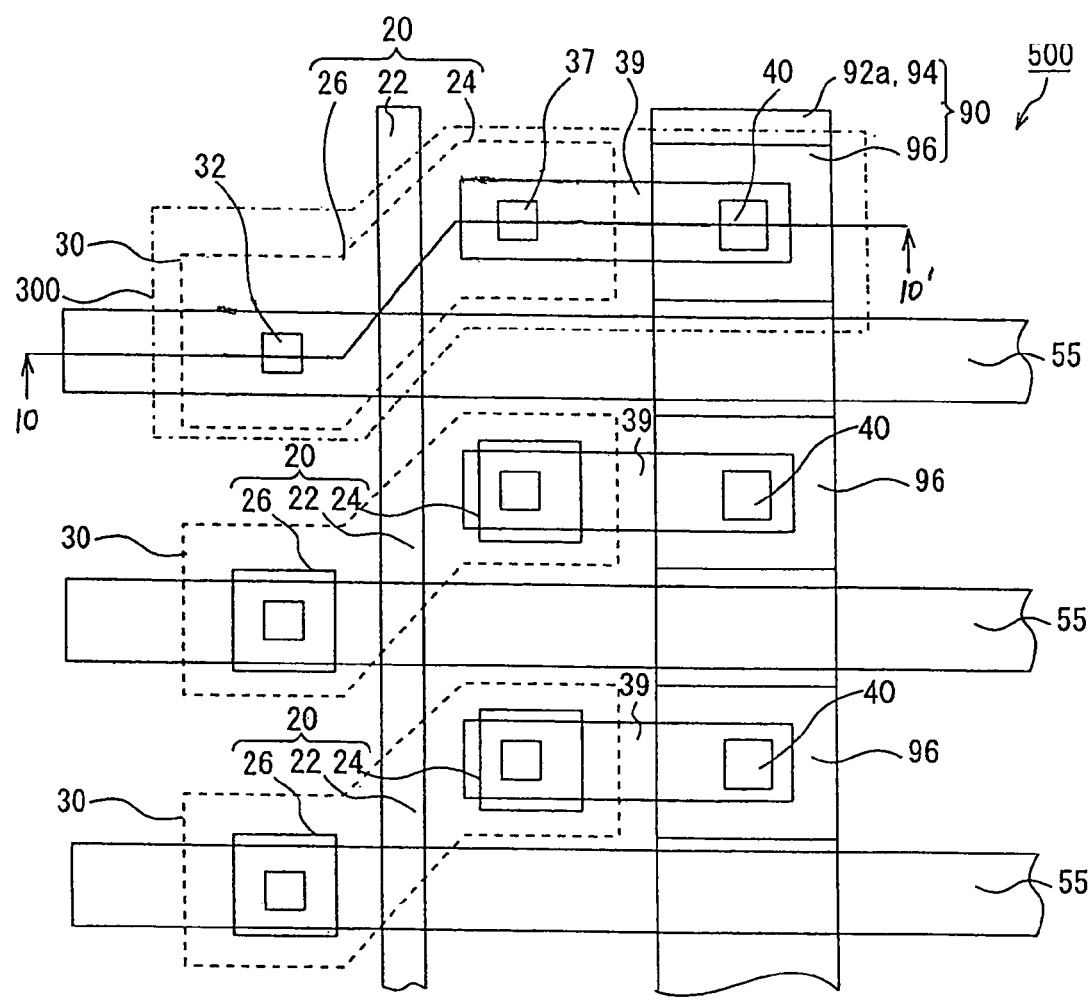
FIG. 11 is a plane view showing the semiconductor device of the fourth embodiment of the present invention.

FIG. 10 is a cross-sectional view showing a semiconductor device 500 of a fourth embodiment of the present invention. FIG. 11 is a plane view showing the semiconductor device 500 of the fourth embodiment of the present invention. Also, the semiconductor device 500 as shown in FIG. 10 is a cross-sectional view taken along line 10–10' in FIG. 11. In this embodiment, a planar type FeRAM is described.

Initially, the semiconductor device 500 is explained in reference to FIG. 11. A memory cell 300 of the semiconductor device 500 includes the transistor 20 and a ferroelectric capacitor 90 as shown in FIG. 11. The transistor 20 includes the source region as the first region 24 and a drain region as the second region 26 and the gate electrode as the control electrode 22. The first region 24 and the second region 26 are formed in the active area 30 and the gate electrode 22 is arranged on the area which is located between the first region 24 and the second region 26. The gate electrode 22 is used as the word line in the semiconductor device 500. The drain region 26 is connected to the bit line 55 via the bit line contact 32. The source region 24 is connected to one end of a wiring 39 via a contact plug 37. The ferroelectric capacitor 90 includes a ferroelectric layer 94 formed between the bottom electrode 92 and a top electrode 96. The top electrode 96 is connected to the other end of the wiring 39 via a contact hole 40.

Then, the device structure of the semiconductor device 500 is explained in reference to FIG. 10. The transistor 20 includes the gate electrode 22, the source region 24 and the drain region 26 as shown in FIG. 10. The gate electrode 22 is formed on the silicon substrate 12 via a gate insulating layer (not shown). The source region 24 and the drain region 26 are formed in the semiconductor substrate 12 located at both sides of the gate electrode 22. The insulating layer 13 such as silicon dioxide is formed on the transistor 20 and the silicon substrate 12, and the top surface of the insulating layer is flattened.

The source region 24 is connected to the contact plug 37 and the drain region 26 is connected to the bit line contact 32. The contact plug 37 and the bit line contact 32 are formed by embedding a conductive material such as poly crystalline silicon or tungsten in contact holes 33 which are formed in the insulating layer 13.

The ferroelectric capacitor 90 includes the bottom electrode 92 formed on an adhesive layer 11 such as titanium oxide, a dielectric layer 93 formed on the bottom electrode 92, the ferroelectric layer 94 formed on the bottom electrode 92 and the dielectric layer 93, and the top electrode 96 formed on the ferroelectric layer 94. The bottom electrode 92 includes a plate portion 92a and a projection portion 92b formed on a surface "a" of the plate portion 92a. The plate portion 92a includes an iridium layer 921 formed on the adhesive layer 11 and an iridium oxide layer 922 formed on the iridium layer 921. The projection portion 92b is made of platinum. The projection portion 92b is located at a central area of the surface "a" of the plate portion 92a. The dielectric layer 93 is formed around the projection portion 92b and a top surface of the dielectric layer 93 is aligned to a top surface "b" of the projection portion 92b. The dielectric layer 93 is made of silicon dioxide or silicon nitride. The ferroelectric layer 94 is formed on the top surface "b" of the projection portion 92b and on the dielectric layer 93. The ferroelectric layer 94 is made of strontium bismuth tantalate ($SrBi_2Ta_2O_9$). The top electrode 96 is formed on the ferroelectric layer 94 and is made of platinum.

In this embodiment, the plate portion 92a of the bottom electrode 92 is used as a plate line of the semiconductor device 500. That is, the plate portion 92a of the bottom electrode 92 has a line shaped and a plurality of the ferroelectric capacitors 90 share the common plate portion 92a. Also, the ferroelectric layer 94 has a line shaped and is formed on the bottom electrode 92 so as to extend along the bottom electrode 92. Each of the top electrodes 96 is formed on the respective ferroelectric capacitor 90 separately so as to cover the projection portion 92a of the each bottom electrode 92.

In this embodiment, the capacitor 90 is rectangular in shape. Also, the projection portion 92b is rectangular in shape. Each side of the projection portion 92b of the bottom electrode 92 is shorter than corresponding side of the plate portion 92a of the bottom electrode 92. A side surface "e" of the plate portion 92a, a side surface "f" of the dielectric layer 93, a side surface "g" of the ferroelectric layer 94 and a side surface "h" of the top electrode 96 are aligned with each other.

The insulating layer 16 such as silicon dielectric has contact holes 23. The contact plug 37 and the bit line contact 32 are exposed in the contact holes 23. The top electrode 96 of the ferroelectric capacitor 90 and the source region 24 of the transistor 20 are connected by the wiring 39. The drain region 26 of the transistor 20 is connected to a bit line 55 via the bit line contact 32.

Next, a method of fabricating the semiconductor device 500 is explained with reference to FIGS. 12(A)–12(C) and FIGS. 13(A)–13(C).

Figure 12:
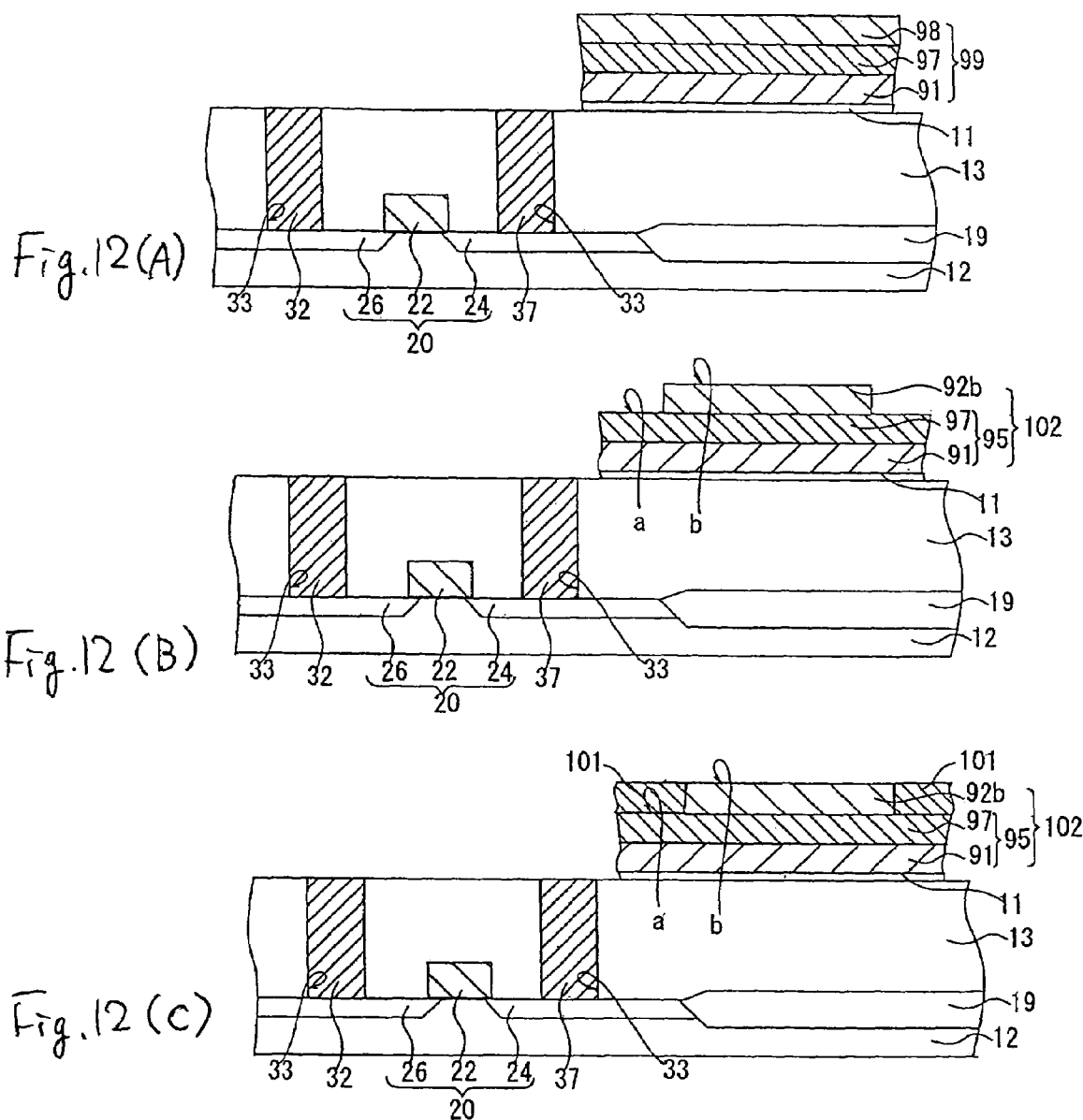
FIGS. 12(A) to 12(C) are views showing manufacturing steps for a semiconductor device of the fourth embodiment of the present invention.

First, as shown in FIG. 12(A), a plurality of transistors 20 and the insulating layer 13 are formed on the semiconductor substrate 12 as the same method of the first embodiment. Then, contact holes 33 are formed in the insulating layer 13. A tungsten layer is formed in the contact holes 33 and on the insulating layer 13. Then, for forming the plug 37 and the bit line contact 32, the tungsten layer is polished by the CMP technique so as to align with the top surface of the insulating layer 13.

Then, the adhesive layer 11 such as titanium oxide which has 70 nm thickness is formed on the insulating layer 13 by the reactive sputtering technique.

Then, a conductive layer 99 is formed in the following steps. An iridium layer 91 having 100 nm thickness is formed on the adhesive layer 11 by a sputtering technique, an iridium oxide layer 97 which has 50 nm thickness is formed on the iridium layer 91 by a reactive sputtering technique, and a platinum layer 98 which has 100 nm thickness is formed on the iridium oxide layer 97 by a sputtering technique.

Then, the platinum layer 98 is etched so that the projection portion 92b is formed and the iridium oxide layer 97 is exposed. The platinum layer 98 is etched by a mixed gas of chlorine(Cl) and argon(Ar). In this step, a bottom electrode layer 102 which has a projection portion 92b is obtained as shown in FIG. 12(B).

Then, a dielectric layer 101 is formed on the bottom electrode 102 and the dielectric layer 101 is etched back so that the top surface "b" of the projection portion 92b is exposed from the dielectric layer 101. As a result, a top surface of the dielectric layer 101 is aligned to the top surface "b" of the projection portion 92b as shown in FIG. 12(C).

Then, a strontium bismuth tantalate solution is supplied on the dielectric layer 101 and the projection portion 92a by a spin coat method. After the solution is dried, the dried solution is annealed in an oxygen atmosphere at 700° C. for one minute by an RTA method. As a result, a strontium bismuth tantalate layer that has 50 nm thickness is obtained. Then, the coating step and the RTA step are performed two further times at 750° C. for one minute. As a result, a 150 nm thickness strontium bismuth tantalate layer 104 is obtained, as shown in FIG. 13(A).

Figure 13:
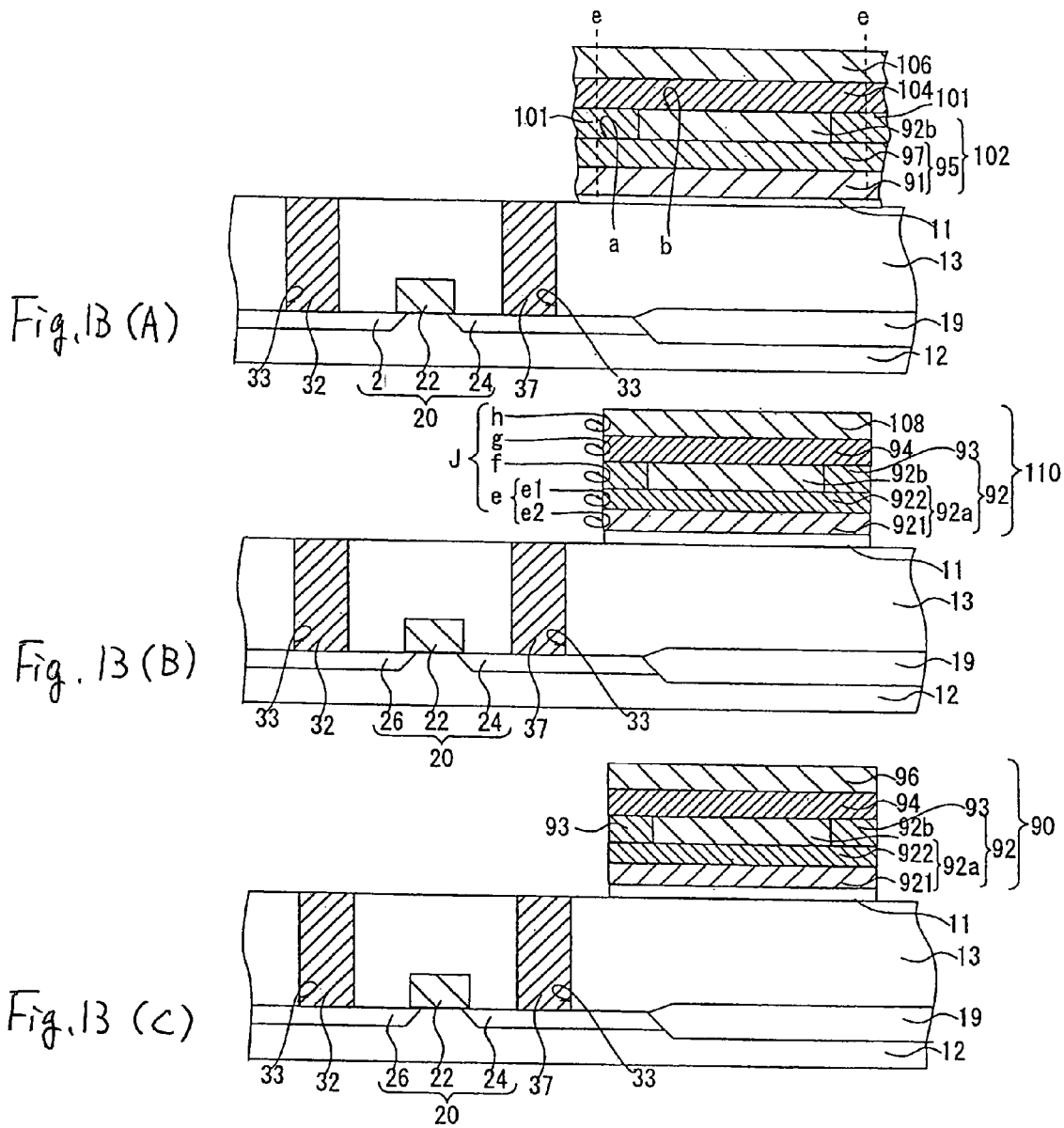
FIGS. 13(A) to 13(C) are views showing manufacturing steps for a semiconductor device of the fourth embodiment of the present invention.

Then, a 100 nm thickness platinum layer 106 as the top electrode layer is formed on the strontium bismuth tantalate layer 104 by the sputtering method as further shown in FIG. 13(A). Then, the top electrode layer 106, the ferroelectric layer 104, the dielectric layer 101 and the plate portion 95 of the bottom electrode layer 102 are etched so as to form a ferroelectric structure 110 as shown in FIG. 13(B). The side surface "e" of the plate portion 92a, the side surface "f" of the dielectric layer 93, the side surface "g" of the ferroelectric layer 94 and the side surface "h" of the top electrode 108 are aligned.

Then, the top electrode 108 is etched so as to obtain the separated top electrodes 96 as shown in FIG. 13(C).

Then, the insulating layer 16 such as silicon dioxide is formed on the ferroelectric capacitor 90 by a CVD technique. Then, the contact holes 23 are formed in the insulating layer 16. Then, the wiring 39 for connecting the separated top electrode 96 to the corresponding contact plug 37 and the bit line 55 for connecting to the bit line contact 32 are formed.

In this embodiment, the effective area of the ferroelectric capacitor is the same as the area of the top surface of the projection portion 92b. Therefore, the damage area which is formed on the side surface of the ferroelectric layer 90 is arranged at the spacer area which is out of the effective area.

While the preferred form of the present invention has been described, it is to be understood that modifications will be apparent to those skilled in the art without departing from the spirit of the invention. The scope of the invention is to be determined solely by the following claims.

What is claimed is:

1. A ferroelectric capacitor comprising:
a bottom electrode which has a first region and a second region, wherein the first region has a first thickness and the second region has a second thickness greater than the first thickness, and wherein the second region is arranged at a central area of the bottom electrode and the first region is arranged at a peripheral area of the bottom electrode;
a dielectric layer formed on the first region of the bottom electrode;
a ferroelectric layer formed on the dielectric layer and on the second region of the bottom electrode; and
a top electrode formed on the ferroelectric layer,
wherein the dielectric layer is sandwiched between the first region of the bottom electrode and the ferroelectric layer,
wherein a side end surface of the first region of the bottom electrode, a side end surface of the dielectric layer, a side end surface of the ferroelectric layer and a side end surface of the top electrode are aligned, and
wherein a distance between the bottom electrode and the top electrode at the side end surfaces is greater than a distance between the bottom electrode and the top electrode at the second region.

2. The ferroelectric capacitor of claim 1, wherein the ferroelectric layer includes a damaged area which is formed on the dielectric layer.

3. The ferroelectric capacitor of claim 1, wherein the bottom electrode comprises the first region and the second region as a single unitary electrode.

4. The ferroelectric capacitor of claim 1, wherein a top surface of the dielectric layer is substantially coplanar and aligned with a top surface of the second region.

5. The ferroelectric capacitor of claim 1, wherein the bottom electrode and the top electrode are made of an oxidation resistance metal or a conductive metal oxide.

6. The ferroelectric capacitor of claim 1, wherein the second region of the bottom electrode includes a lower layer and an upper layer.

7. The ferroelectric capacitor of claim 6, wherein the upper layer of the second region of the bottom electrode is made of a material different than the first region and the lower layer of the second region of the bottom electrode.

8. The ferroelectric capacitor of claim 7, wherein the upper layer of the second region of the bottom electrode is made of platinum.

9. A ferroelectric capacitor comprising:
a bottom electrode having a step area;
a top electrode;
a ferroelectric layer formed between the bottom electrode and the top electrode; and
a dielectric spacer formed between the bottom electrode and the top electrode,
wherein a distance between the bottom electrode and the top electrode at a side end surface of the step area is greater than a distance between the bottom electrode and the top electrode at a central area of the ferroelectric capacitor, and
wherein the dielectric spacer decreases an electric field strength at the step area of the bottom electrode.

10. The ferroelectric capacitor of claim 9, wherein the bottom electrode includes a projecting portion arranged at a central area of the bottom electrode, and wherein the dielectric spacer is arranged around the projecting portion on the step area.

11. The ferroelectric capacitor of claim 9, wherein a side end surface of the bottom electrode, a side end surface of the ferroelectric layer, a side end surface of the dielectric spacer and a side end surface of the top electrode are aligned.

12. A ferroelectric capacitor comprising:
a first electrode which has a plate portion and a projecting portion, wherein the projecting portion is arranged on a central area of the plate portion;
a spacer layer formed on a peripheral area of the first electrode and arranged around the projecting portion of the first electrode;
a ferroelectric layer formed on the spacer layer and on the projecting portion; and
a second electrode formed on the ferroelectric layer,
wherein a side end surface of the plate portion of the first electrode, a side end surface of the ferroelectric layer and a side end surface of the second electrode are aligned, and
wherein a distance between the plate portion of the first electrode and the second electrode at the side end surfaces is greater than a distance between the projecting portion of the first electrode and the second electrode.

13. A semiconductor device comprising:
a semiconductor substrate;
a switching transistor formed on the semiconductor substrate, the switching transistor having a source region, a drain region and a gate electrode;
an insulating layer formed on the semiconductor substrate and the switching transistor;
a ferroelectric capacitor formed on a top surface of the insulating layer, the ferroelectric capacitor including
a bottom electrode formed on the insulating layer, the bottom electrode has a first region which has a first thickness and a second region which has a second thickness greater than the first thickness, wherein the second region is arranged at a central area of the bottom electrode and the first region is arranged at a peripheral area of the bottom electrode, a dielectric layer formed on the first region of the bottom electrode, a ferroelectric layer formed on the dielectric layer and on the second region, and a top electrode formed on the ferroelectric layer, wherein the dielectric layer is sandwiched between the first region of the bottom electrode and the ferroelectric layer, wherein a side end surface of the first region of the bottom electrode, a side end surface of the dielectric layer, a side end surface of the ferroelectric layer and a side end surface of the top electrode are aligned, and wherein a distance between the bottom electrode and the top electrode at the side end surfaces is greater than a distance between the bottom electrode and the top electrode at the second region; and a plug electrode which is embedded in the insulating layer, wherein the plug electrode connects the source region of the switching transistor to the bottom electrode of the ferroelectric capacitor.

14. The semiconductor device of claim 13, wherein the top surface of the insulating layer is formed substantially flat.

15. The semiconductor device of claim 13, wherein the ferroelectric capacitor is located over the source region of the switching transistor.

16. A semiconductor device comprising:

a semiconductor substrate;

a switching transistor formed on the semiconductor substrate, the switching transistor having a source region, a drain region and a gate electrode;

an insulating layer formed on the semiconductor substrate and the switching transistor;

a ferroelectric capacitor formed on a top surface of the insulating layer, the ferroelectric capacitor including a bottom electrode formed on the insulating layer, the bottom electrode has a first region which has a first thickness and a second region which has a second thickness greater than the first thickness, wherein the second region is arranged at a central area of the bottom electrode and the first region is arranged at a peripheral area of the bottom electrode, a dielectric layer formed on the first region of the bottom electrode, a ferroelectric layer formed on the dielectric layer and on the second region, and a top electrode formed on the ferroelectric layer, wherein the dielectric layer is sandwiched between the first region of the bottom electrode and the ferroelectric layer, wherein a side end surface of the first region of the bottom electrode, a side end surface of the dielectric layer, a side end surface of the ferroelectric layer and a side end surface of the top electrode are aligned, and wherein a distance between the bottom electrode and the top electrode at the side end surfaces is greater than a distance between the bottom electrode and the top electrode at the second region; and a wiring which connects the source region of the switching transistor to the top electrode of the ferroelectric capacitor.

17. The semiconductor device of claim 16, wherein the wiring includes a plug portion which extends from the source region of the switching transistor to the top surface of the insulating layer and a wiring portion which connects a top of the plug to the top electrode of the ferroelectric capacitor.

18. A ferroelectric capacitor which includes a central area and a peripheral area, comprising:

a bottom electrode;

a top electrode;

a ferroelectric layer which is arranged between the top electrode and the bottom electrode; and a dielectric layer which is arranged between the bottom electrode and the top electrode at a peripheral area of the ferroelectric capacitor, so that an electric field strength at the peripheral area of the ferroelectric capacitor is lower than an electric field strength at a central area of the ferroelectric capacitor, wherein a side end surface of the bottom electrode, a side end surface of the dielectric layer, a side end surface of the ferroelectric layer and a side end surface of the top electrode are aligned, and wherein a distance between the bottom electrode and the top electrode at the side end surfaces is greater than a distance between the bottom electrode and the top electrode at the central area.

* * * * *